(12) United States Patent
Thompson et al.

(10) Patent No.: US 7,518,066 B2
(45) Date of Patent: Apr. 14, 2009

(54) CONFORMABLE INTERFACE DEVICE FOR IMPROVED ELECTRICAL JOINT

(75) Inventors: Alex Thompson, Fullerton, CA (US); Terence G. Ward, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 380 days.

(21) Appl. No.: 11/218,053

(22) Filed: Sep. 1, 2005

(65) Prior Publication Data

US 2007/0044422 A1    Mar. 1, 2007

(51) Int. Cl.
*H05K 1/16* (2006.01)
(52) U.S. Cl. ...................................... 174/262; 174/252
(58) Field of Classification Search .................. 174/252, 174/260, 261, 255
See application file for complete search history.

(56) References Cited

U.S. PATENT DOCUMENTS

| 4,151,547 A | * | 4/1979 | Rhoades et al. | 257/718 |
| 6,131,646 A | * | 10/2000 | Kelley | 165/80.1 |
| 7,200,006 B2 | * | 4/2007 | Farrow et al. | 361/704 |

* cited by examiner

*Primary Examiner*—Ishwar (I. B.) Patel

(57) ABSTRACT

An interface device for coupling an electrical device to a metal junction includes a conformable conductor plate having a first side and a second side. The interface device also includes a plurality of first channels that intersect with a plurality of second channels formed on at least one of the first side and the second side. The formation of the first channels and the second channels weaken the conductor plate. A plurality of protrusions is formed by the intersection of the first channels and the second channels. The protrusions are deformable by coupling the conformable plate between the electrical device and the metal junction. An elongated slot formed throughout at least a portion of the interface device.

16 Claims, 15 Drawing Sheets

US 7,518,066 B2

CONFORMABLE INTERFACE DEVICE FOR IMPROVED ELECTRICAL JOINT

CROSS-REFERENCE TO RELATED APPLICATIONS

This application relates to U.S. application Ser. No. 11/217,971, filed on Sep. 1, 2005, and entitled Heat Transfer Plate, which is hereby incorporated by reference in its entirety as if fully set forth herein.

FIELD OF THE INVENTION

The present invention relates to an interface device and particularly relates to a conformable conductor plate in an electrical joint.

BACKGROUND OF THE INVENTION

Electronic devices may generate heat due to resistance and or relatively poor electrical contact between the electronic device and a common metal junction. Inadequate attachment of the electronic device to the metal junction may further decrease the electrical contact therebetween. When the electronic device is better secured to the metal junction, the electronic device is capable of rejecting more waste heat, has better electrical contact and is more able to maintain a lower temperature.

The common metal junction may be, for example, a bus bar and the electronic device may be a transistor. A surface on the bus bar may abut a surface on the transistor to form an electrical and a thermal connection therebetween. The respective surfaces, however, are typically imperfect and may provide less actual contact between the respective surfaces (e.g., metal-to-metal contact). The imperfections, due to surface irregularities, may create a void (i.e., a volume of air) between the respective surfaces. Moreover, failure to adequately secure the transistor to the bus bar can further reduce contact therebetween. When there is less actual contact between the respective surfaces, there may be increased resistance and less electrical contact between the bus bar and the transistor, which may cause increased heating and may cause the transistor to fail.

Traditionally, an electrically conductive powder or paste is added between the transistor and the bus bar. The electrical conductivity of the powder or paste may be low relative to the respective metal surfaces of the bus bar and the transistor. Notwithstanding the low electrical conductivity, the powder or paste may fill the volume between the respective surfaces, which may relatively increase the area of contact and thus decrease the resistance between the bus bar and the transistor. The powder or paste, however, may dry and crack over time, which may once again introduce air pockets. The air pockets may reduce the actual contact between the transistor and the bus bar, thus increasing the resistance therebetween and diminishing the benefit of the powder or paste. Moreover, use of the powder or the paste in mass production may be undesirable because of handling or assembly issues.

SUMMARY OF THE INVENTION

An interface device for coupling an electrical device to a metal junction includes a conformable conductor plate having a first side and a second side. The interface device also includes a plurality of first channels that intersect with a plurality of second channels formed on at least the first side or the second side. The formation of the first channels and the second channels weaken the conductor plate. A plurality of protrusions is formed by the intersection of the first channels and the second channels. The protrusions are deformable by coupling the conformable plate between the electrical device and the metal junction. An elongated slot formed throughout at least a portion of the interface device.

In one feature, the protrusions include a face having a surface area that abuts one of the electrical device and the metal junction, at least one said faces increasing said surface area when compressed between the electrical device and the metal junction.

In another feature, the conductor plate is made of copper.

In yet another feature, the conductor plate is at least partially plated with gold.

In still another feature, the conductor plate is at least partially plated with silver.

Further areas of applicability of the present invention will become apparent from the detailed description provided hereinafter. It should be understood that the detailed description and specific examples, while indicating the various embodiments of the invention, are intended for purposes of illustration only and are not intended to limit the scope of the invention.

BRIEF DESCRIPTION OF THE DRAWINGS

The present invention will become more fully understood from the detailed description, the appended claims and the accompanying drawings, wherein:

DETAILED DESCRIPTION OF THE VARIOUS EMBODIMENTS

The following description of the various embodiments is merely exemplary in nature and is in no way intended to limit the invention, its application, or uses.

Figure 1:
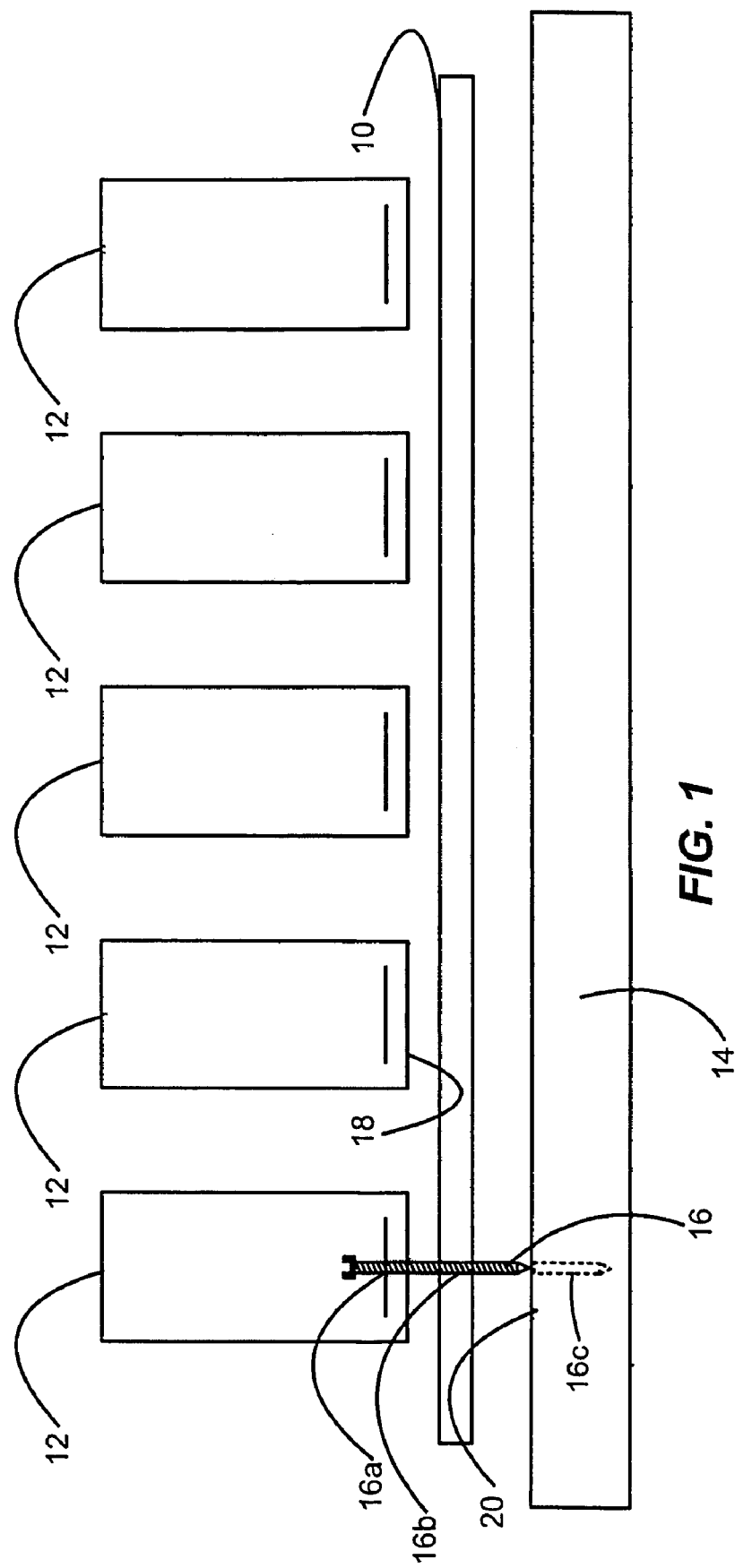
FIG. 1 is an exemplary schematic view of an exemplary electric device, an exemplary metal junction and a conductor plate constructed in accordance with the teachings of the present invention.

With reference to FIG. 1, a conformable conductor plate 10 is shown in accordance with the teachings of the present invention. The conductor plate 10 may connect a plurality of electrical devices 12 to a common metal junction, such as a bus bar 14 or other common electrical substrates. The electrical devices 12 may include, for example, a Metal-Oxide-Semiconductor Field Effect Transistors (Mosfet). A fastener 16 may be used to secure the electrical device 12 to the bus bar 14 by securing, for example, an electrical device flange 16a to a bus bar fastener aperture 16c, via a conductor plate fastener aperture 16b.

Figure 2:
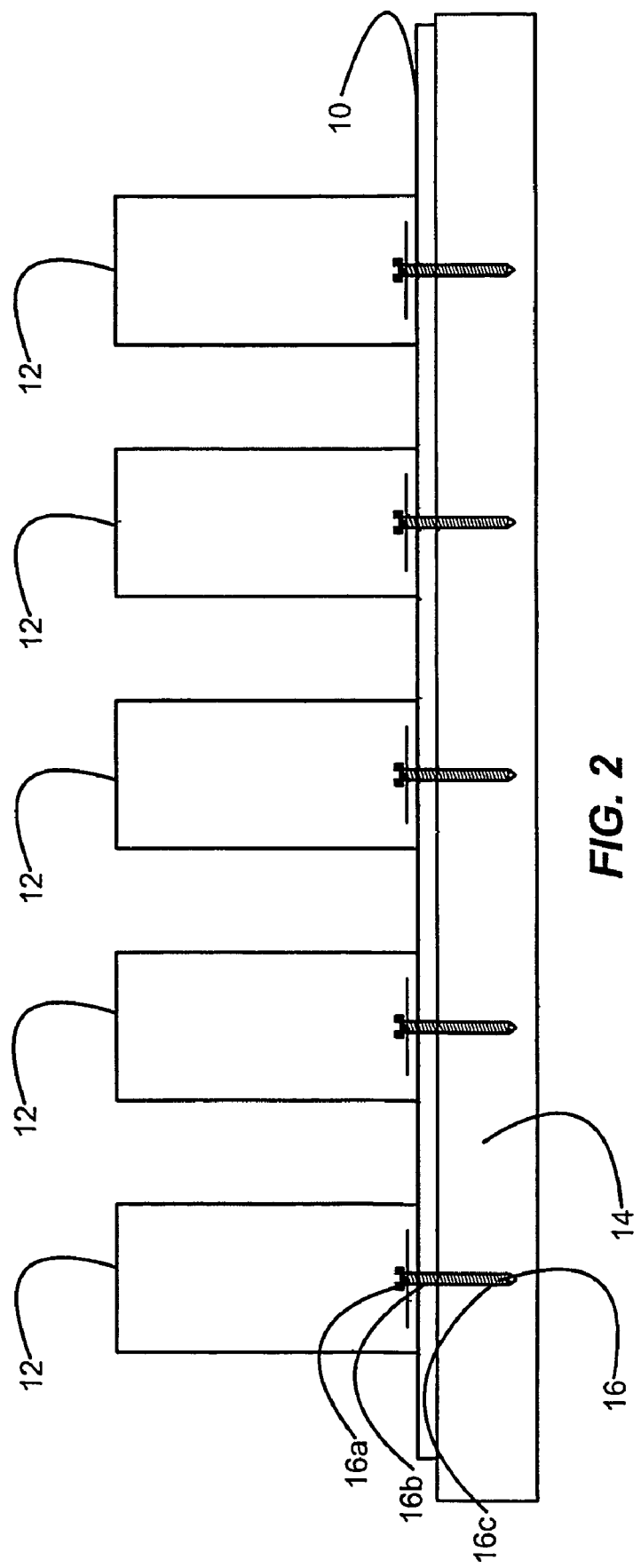
FIG. 2 is similar to FIG. 1 and shows the conductor plate sandwiched between the electric device and the metal junction.

With reference to FIGS. 1 and 2, the electrical device 12 may have a first surface 18 and the bus bar 14 may have a second surface 20. The conductor plate 10 may be pressed between the first surface 18 of the electrical device 12 and second surface 20 of the bus bar 14 to form an improved electrical connection therebetween. The pressing of the conductor plate 10 between one or more of the electrical devices 12 and the bus bar 14 may cause the conductor plate 10 to compress and conform to the surfaces 18, 20 of the electrical devices 12 and the bus bar 14, respectively.

In one example, sufficient pressure may be applied to the electrical device 12, possibly via the fastener 16, to compress the conductor plate 10 against the bus bar 14. When the conductor plate 10 compresses between the two surfaces 18, 20, the conductor plate 10 may spread out and make more metal-to-metal contact with the two surfaces 18, 20, which decreases the resistance therebetween. The compressing of the conductor plate 10 between respective surfaces 18, 20 may mimic the compressing of a traditional paste or powder between the same, as the conductor plate 10 may fill the space (e.g., fill the air gaps) created by the surface imperfections between the electrical device 12 and the bus bar 14.

Figure 3:
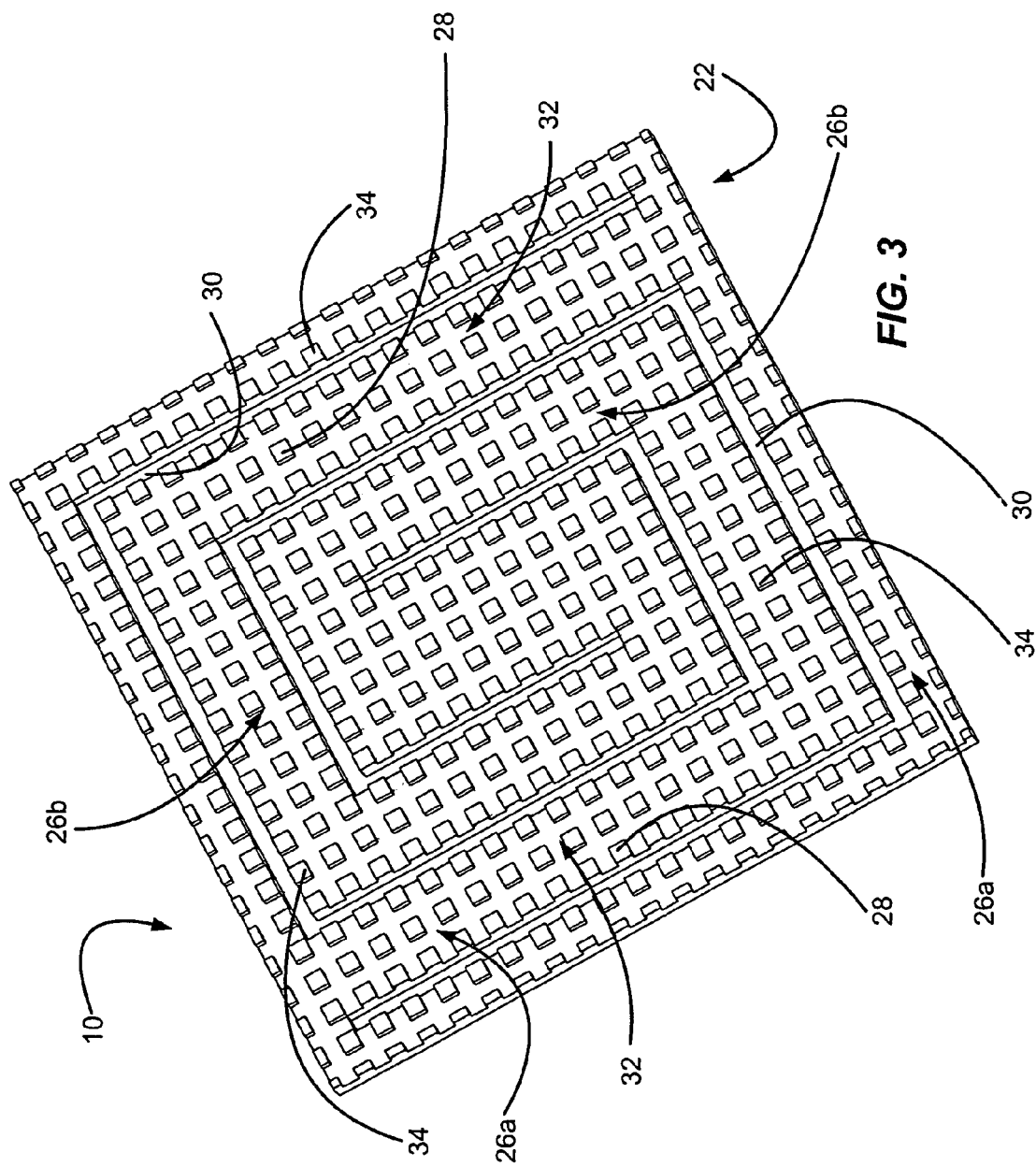
FIG. 3 is a perspective view showing a first side of the conductor plate constructed in accordance with the teachings of the present invention.
Figure 4:
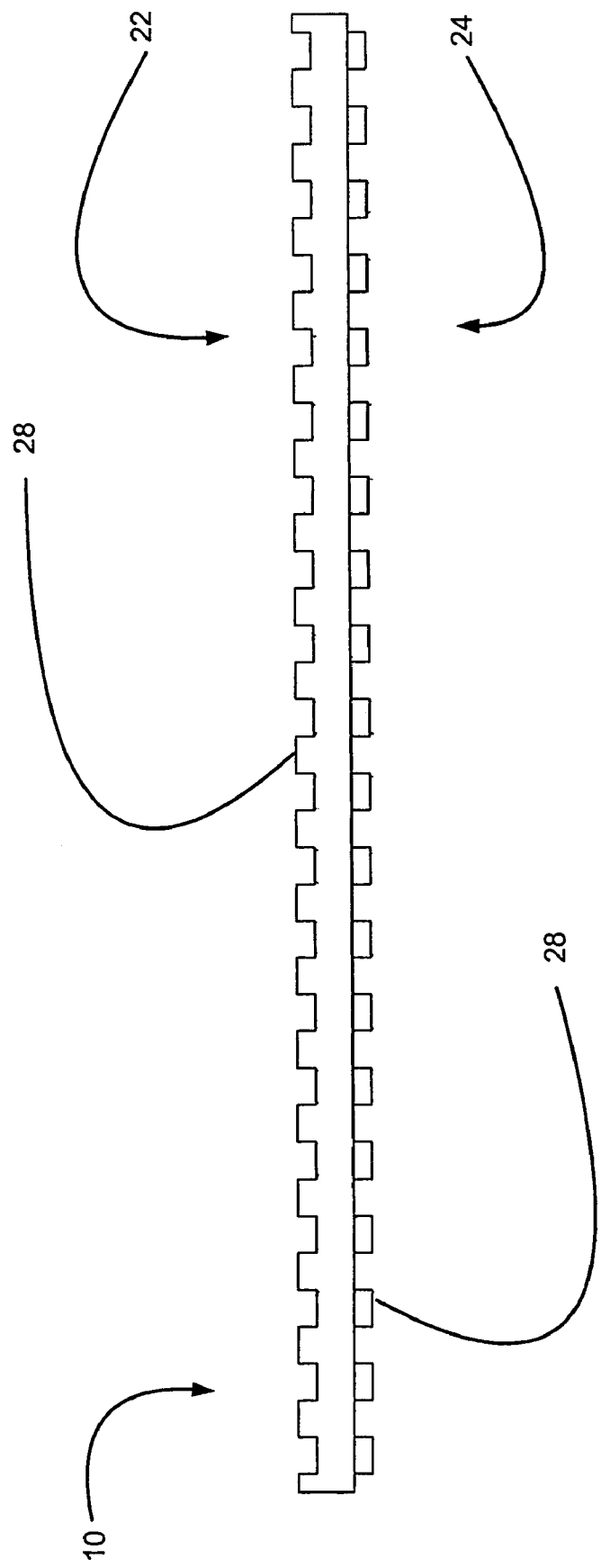
FIG. 4 is a side view of the conductor plate of FIG. 3.

With reference to FIGS. 3 and 4, one embodiment of the conductor plate 10 is shown in accordance with the present invention. The conductor plate 10 has a first side 22 (FIG. 3) and a second side 24 (FIG. 4). The first side 22 and the second side 24 of the conductor plate 10 may include a plurality of channels 26 formed in the conductor plate 10. The channels 26 may be horizontal 26a and/or vertical 26b (collectively referred to hereinafter as channels 26) and as such are orthogonal to each other. A plurality of rectangular-shaped portions 28 may be formed at the intersection of the horizontal and the vertical channels 26. It may be appreciated that the channels 26 need not be orthogonal to one another and therefore the rectangular-shaped portions 28 need not be rectangular but may be any geometric shape that results from the intersection of the channels 26 at various angles.

The conductor plate 10 also may include a plurality of elongated slots 30 formed through the conductor plate 10. The slots 30 may be formed in partial-rectangular shapes that can overlap with one another, as shown in FIG. 3. The configuration of the slots 30 may permit the individual panels 32 (FIG. 3), formed by the slots 30, to flex in different directions with respect to one another. For example, portions of the surfaces 18, 20 of the electronic device 12 and the bus bar 14, respectively, that were not able to electrically connect to one another due to lack of flatness, surface roughness or parallelism of the surfaces 18, 20 are forced into contact as the conductor plate 10 conforms to each of the surfaces 18, 20.

The conductor plate 10 may be formed from a solid rectangular (or otherwise) plate (i.e., no channels and slots formed thereon). The process of forming the conductor plate 10 of the present invention may involve removing material from the solid rectangular plate, which weakens the plate. In one embodiment, an etching process may be used to remove the material thus forming the plurality of horizontal and vertical channels 26 and the slots 30. By way of the above example, each face 34 (FIG. 3) of the plurality of the rectangular-shaped portions 28 includes the original surface of the plate, as the channels 26 are removed around the rectangular-shaped portion 28 during, for example, the etching process.

When the conductor plate 10 is compressed between the electrical device 12 and the bus bar 14, the rectangular-shaped portions 28 will compress thus deforming under the force applied. It may be appreciated that the deformation of the rectangular-shaped portions 28 causes a greater surface area to be exposed to the surfaces 18, 20 because the rectangular-shaped portions 28 spread out when deformed. By spreading out the rectangular-shaped portions 28, the conductor plate 10 may conform to the surface irregularities and non-parallelism found on the surfaces 18, 20.

The conductor plate 10 may be cut to size in situ (i.e., not performed during an earlier and/or separate process) and placed between the electrical device 12 and the bus bar 14. It may be appreciated that the conductor plate 10 may be sized in situ for various models and number of electronic devices 12 and bus bars 14. By way of the above example, each face 34 not shown in FIG. 3 of the rectangular-shaped portions 28 has an original surface area (i.e., $SA_O$) that abuts second surface 20 of the bus bar 14. The conductor plate 10 also has an original height (i.e., $H_O$). After compressing the conductor plate 10 between the electronic device 12 and the bus bar 14, each face 34 not shown in FIG. 3 of the rectangular-shaped portions 28 have a final (i.e., after compressing) surface area (i.e., $SA_F$) and the conductor plate 10 has a final height (i.e., $H_F$). Because the rectangular-shaped portions 28 compress between the electrical device 12 and the bus bar 14, the final surface area is larger than the original surface area (i.e., $SA_F > SA_O$) and the final height is less than the original height (i.e., $H_F < H_O$). It may be appreciated that due to surface irregularities the entire conductor plate 10 need not completely deform and, as such, there may be localized regions of the conductor plate 10 where no deformation takes place (i.e., $SA_F = SA_O$ and $H_F = H_O$).

The conductor plate 10 may be constructed of a suitable material that is thermally conductive such as copper. In addition, the conductor plate 10 may be plated with a highly-conductive metal such as silver or gold. It may be appreciated that the conductor plate 10 may be made of various materials and combinations thereof that provide relativity high electrical conductivity. It may also be appreciated that other suitable coatings may be applied to the conductor plate 10 to enhance electrical and/or thermal conductivity.

In one embodiment of the present invention, the conductor plate 10 may have a thickness (i.e., a dimension from the first side 22 (FIG. 3) to the second side 24 (FIG. 4)) of about 0.003 inches (about 0.076 millimeters). A width of the horizontal channels 26a (FIG. 3) may be about 0.003 inches (about 0.076 millimeters). The dimensions of the rectangular-shaped portions 28 may be about 0.006 inches by about 0.006 inches (about 0.15 millimeters by about 0.15 millimeters). It may be appreciated that the thickness of the conductor plate 10 may be about equal to the width of the channels 26. It may also be appreciated that the above-stated dimensions need not be implemented exactly but only serve as exemplary dimensions that provide for a conformable conductor plate 10.

Figure 5:
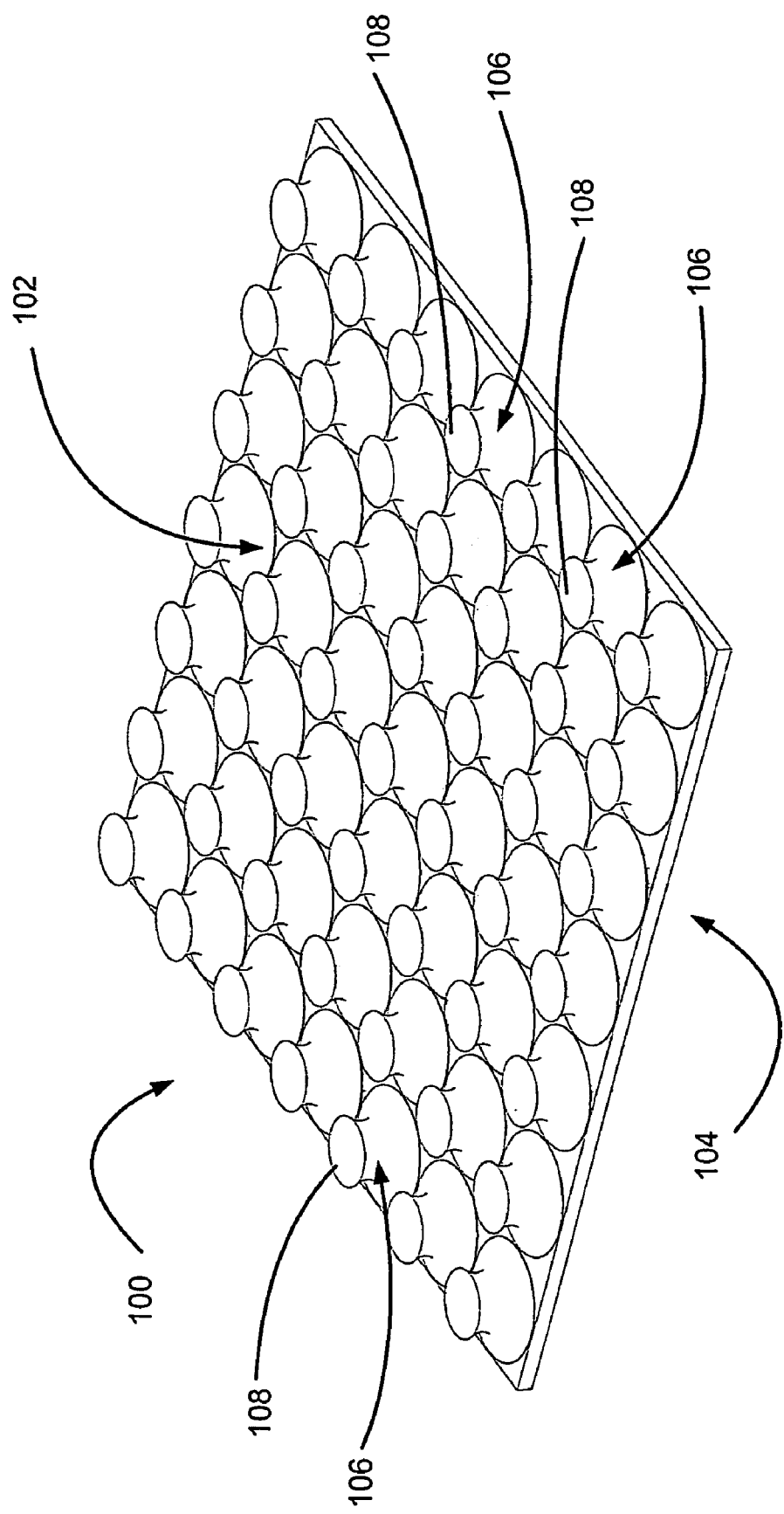
FIGS. 5-7 are perspective views of alternative embodiments of a conductor plate constructed in accordance with the teachings of the present invention.

With reference to FIG. 5, an alternative embodiment of a conductor plate 100 is shown and constructed in accordance with the teachings of the present invention. The conductor plate 100 may include a first side 102 and a second side 104. The first side 102 may include a plurality of round posts 106. The round post 106 may be formed from removal of adjacent material during, for example, the etching process, which is similar to the above-described fabrication of the conductor plate 10 (FIG. 3). As such, each face 108 of the posts 106 may include the original surface of the first side 102 of the conductor plate 100. The posts 106 may compress or deform under pressure between the above-described electrical device 12 and the bus bar 14, as shown in FIG. 2. Moreover, when the conductor plate 100 compresses between the electrical device 12 and the bus bar 14, the round posts 106 may compress and spread out to make relatively better metal-to-metal contact with the devices 12, 14 and increase the electrical contact therebetween.

Figure 6:
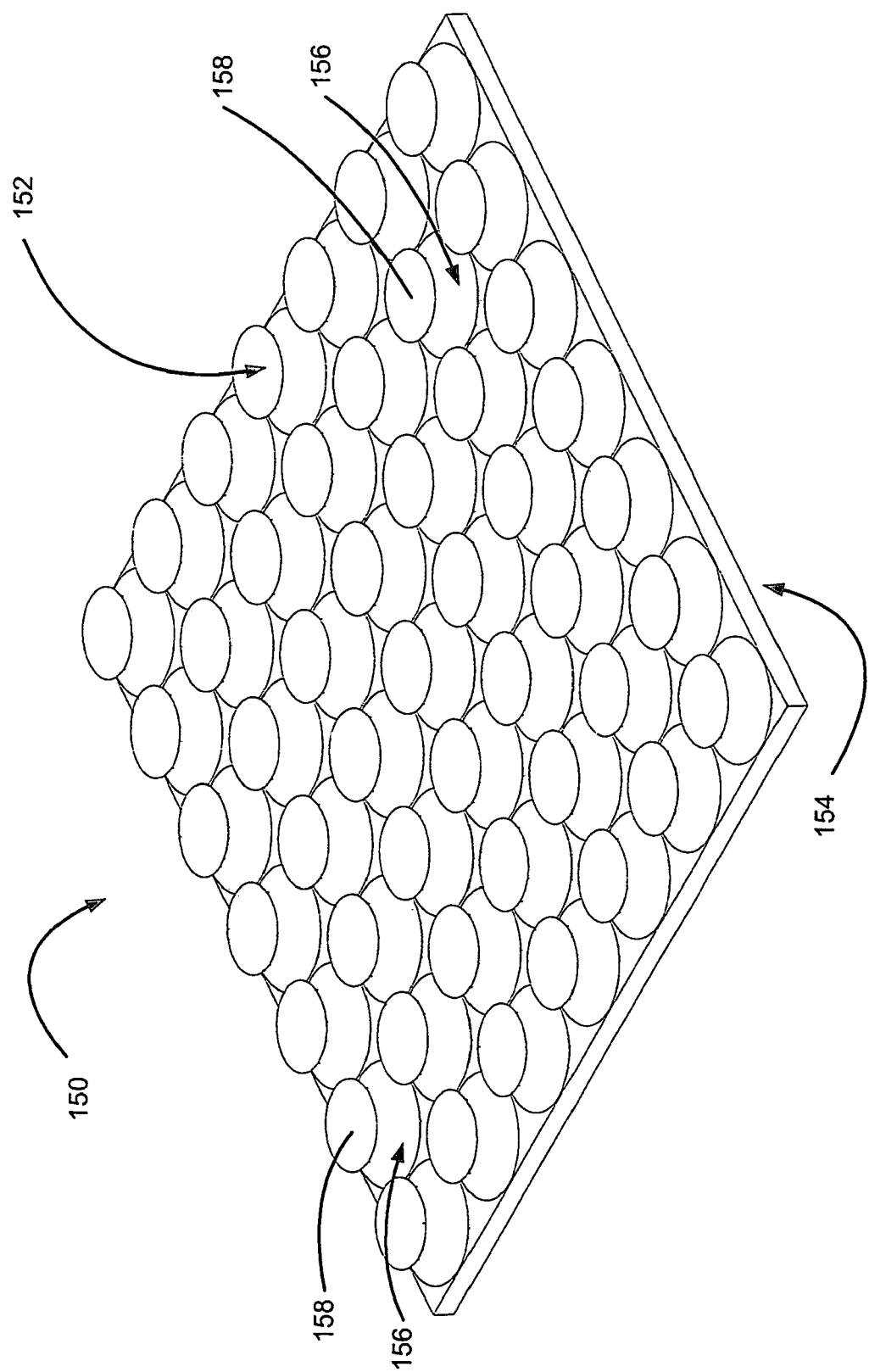

With reference to FIG. 6, an alternative embodiment of a conductor plate 150 is shown and constructed in accordance with the teachings of the present invention. The conductor plate 150 may include a first side 152 and a second side 154. The first side 152 may include a plurality of round posts 156. The round post 156 may be formed from removal of adjacent material during, for example, the etching process, which is similar to the above-described fabrication of the conductor plate 10 (FIG. 3). As such, each face 158 of the posts 156 may include the original surface of the first side 152 of the conductor plate 150. The posts 156 may compress or deform under pressure between the above-described electrical device 12 (FIG. 2) and the bus bar 14 (FIG. 2). Moreover, when the conductor plate 100 compresses between the electrical device 12 and the bus bar 14, the round posts 156 may compress and spread out to make relatively better metal-to-metal contact with the devices 12, 14 and increase the electrical contact therebetween.

Figure 7:
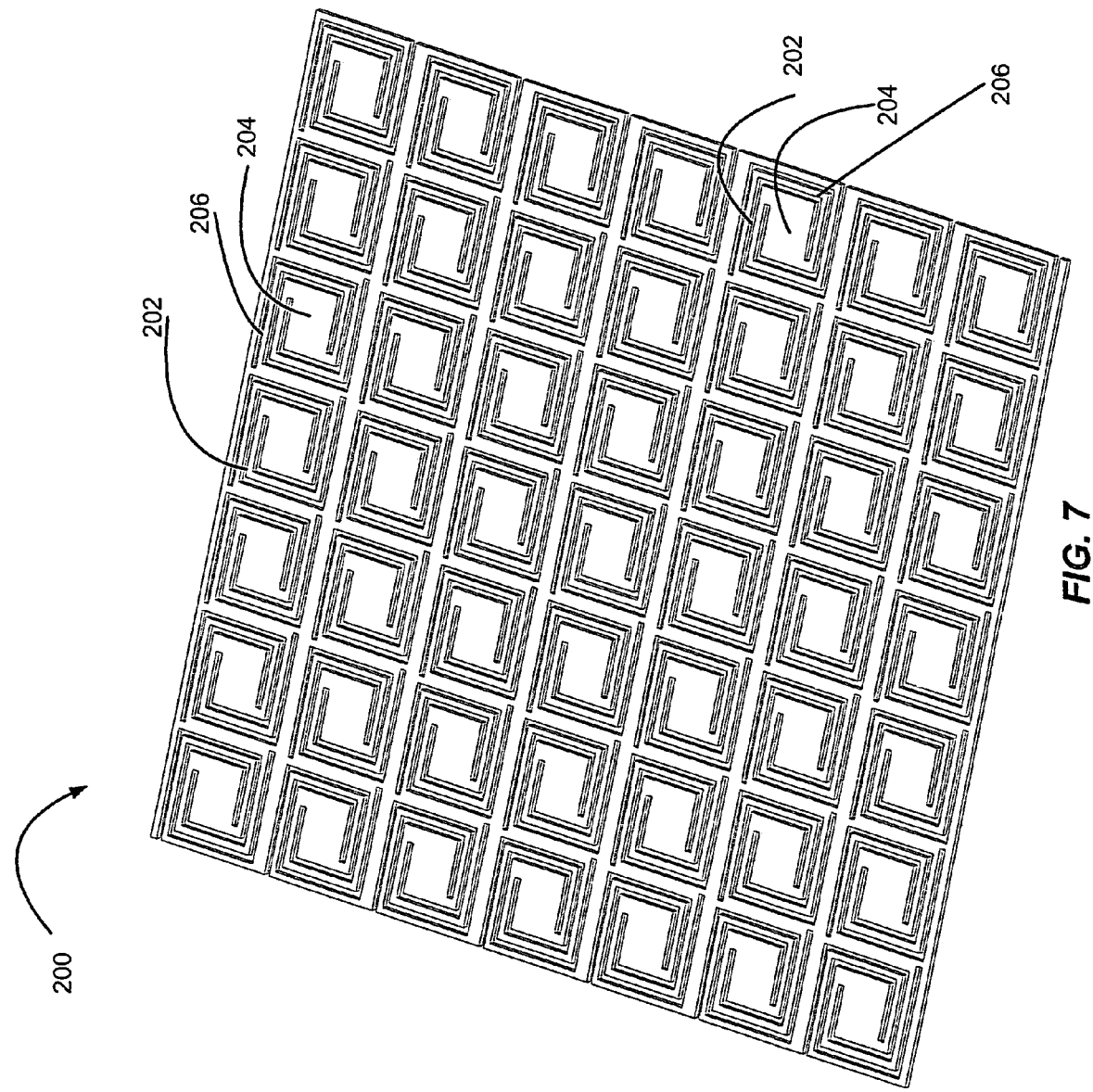

With reference to FIG. 7, an alternative embodiment of the conductor plate 200 is shown and constructed in accordance with the teachings of the present invention. The conductor plate 200 may include a plurality of channels 202 cut therefrom. The channels 202 may be cut, for example, using the above-described exemplary etching process or by stamping. By forming the plurality of channels 202 in the conductor plate 200, a plurality of panels 204 and slats 206 may be formed in the conductor plate 200. It will be appreciated that as the conductor plate 200 is compressed between the electrical device 12 (FIG. 2) and bus bar 14 (FIG. 2), each of the plates 204 and/or the slats 206 may be urged toward the surfaces 18, 20 (FIG. 1) of the two devices 12, 14 to make relatively better metal-to-metal contact and increase the electrical contact therebetween.

Figure 8:
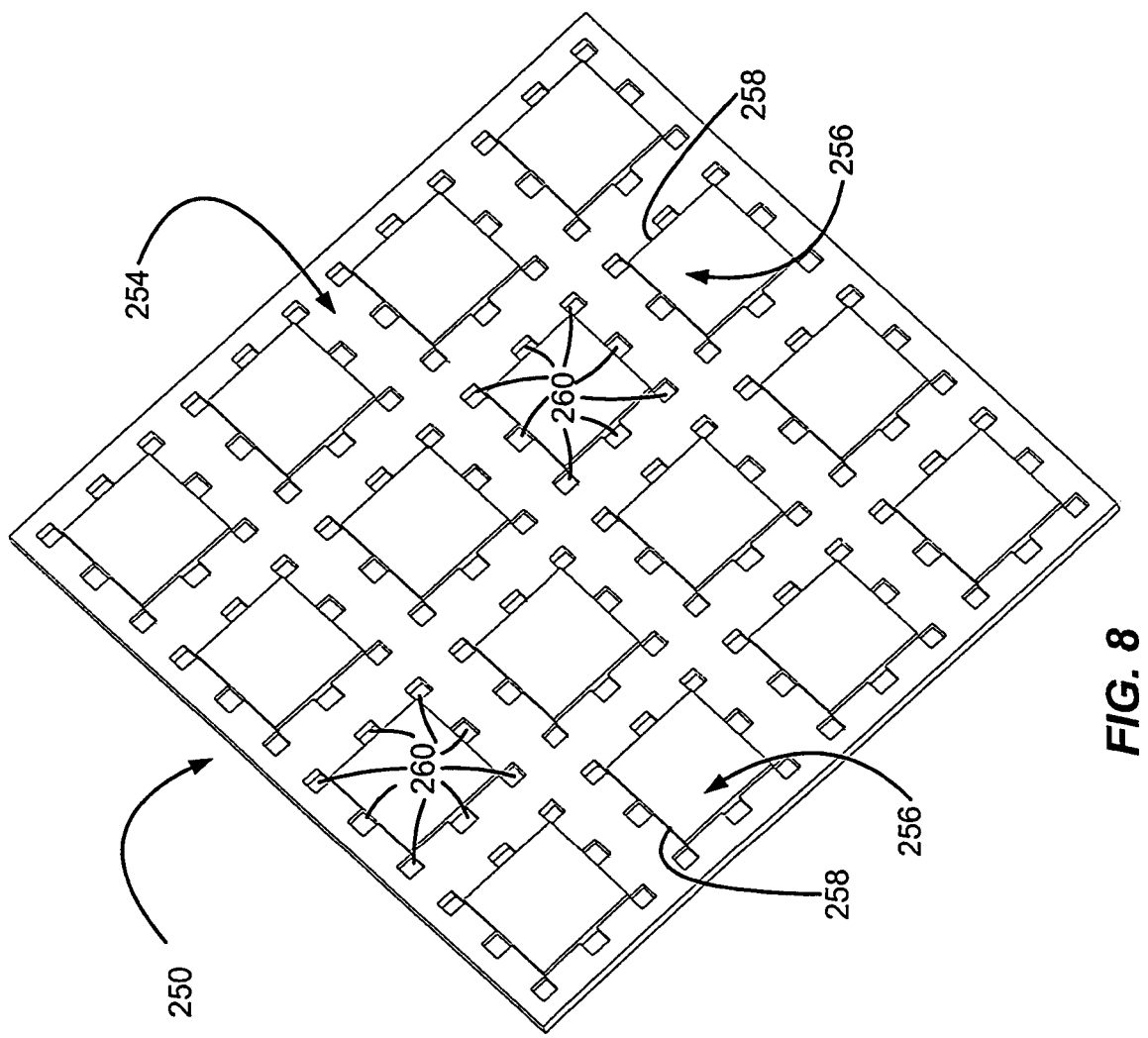
FIG. 8 is a perspective view of another embodiment of a conductor plate constructed in accordance with the teachings of the present invention.
Figure 9:
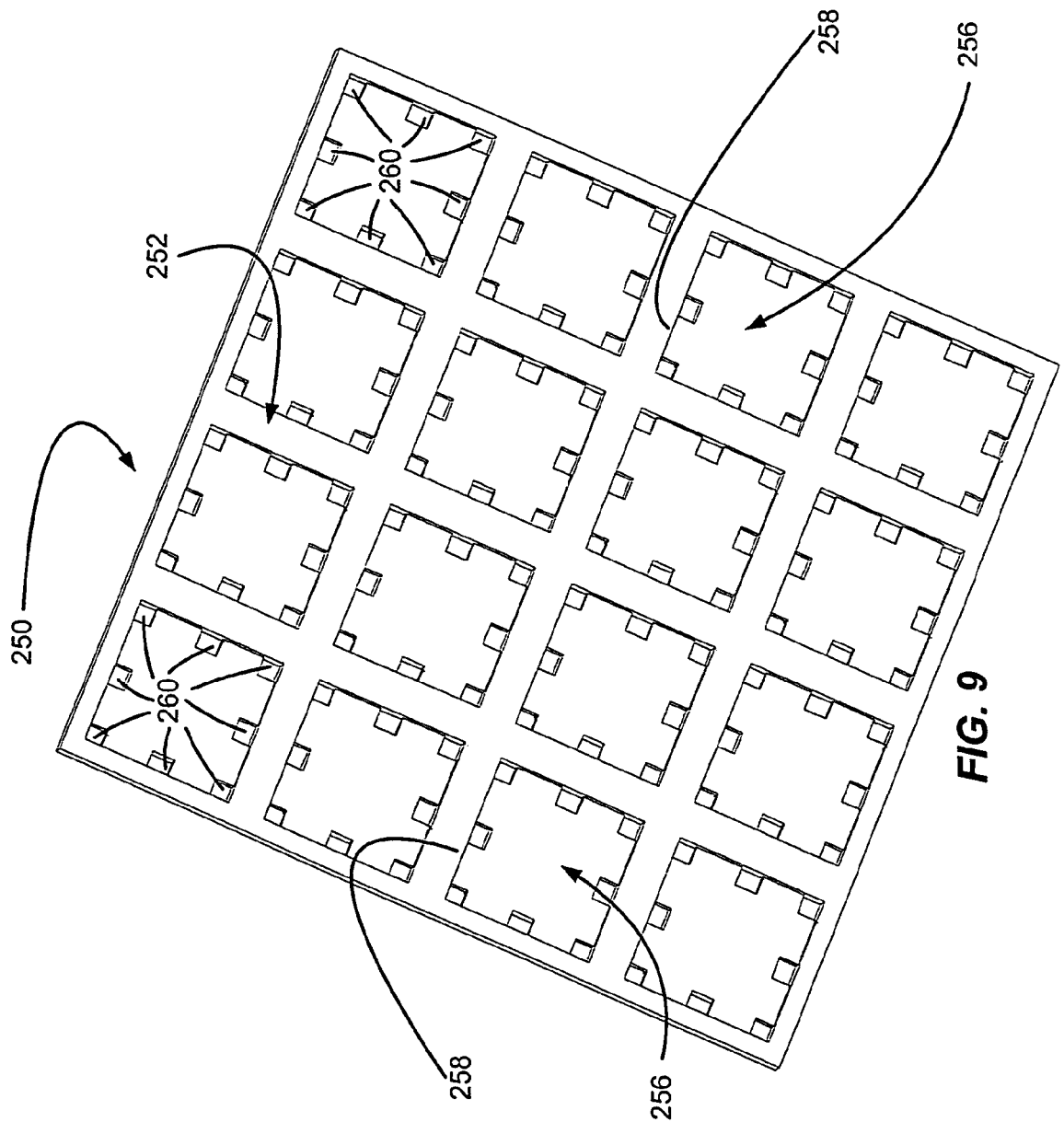
FIG. 9 is similar to FIG. 8 and shows an opposite face of the conductor plate.

With reference to FIGS. 8 and 9, another embodiment of the conductor plate 250 is shown and constructed in accordance with the teachings of the present invention. The conductor plate 250 may include a first side 252 (FIG. 9) and a second side 254 (FIG. 8). Each side of the conductor plate 250 may include a plurality of rectangular-shaped windows 256 cut therefrom. In a periphery 258 of each of the windows 256, a plurality of tabs 260 may be formed thereon. It may be appreciated that as the conductor plate 250 is compressed between the electrical device 12 (FIG. 2) and the bus bar 14 (FIG. 2), the tabs 260 may compress against the surfaces 18, 20 (FIG. 1) of the two devices 12, 14 to make relatively better metal-to-metal contact and increase the electrical contact therebetween.

Figure 10:
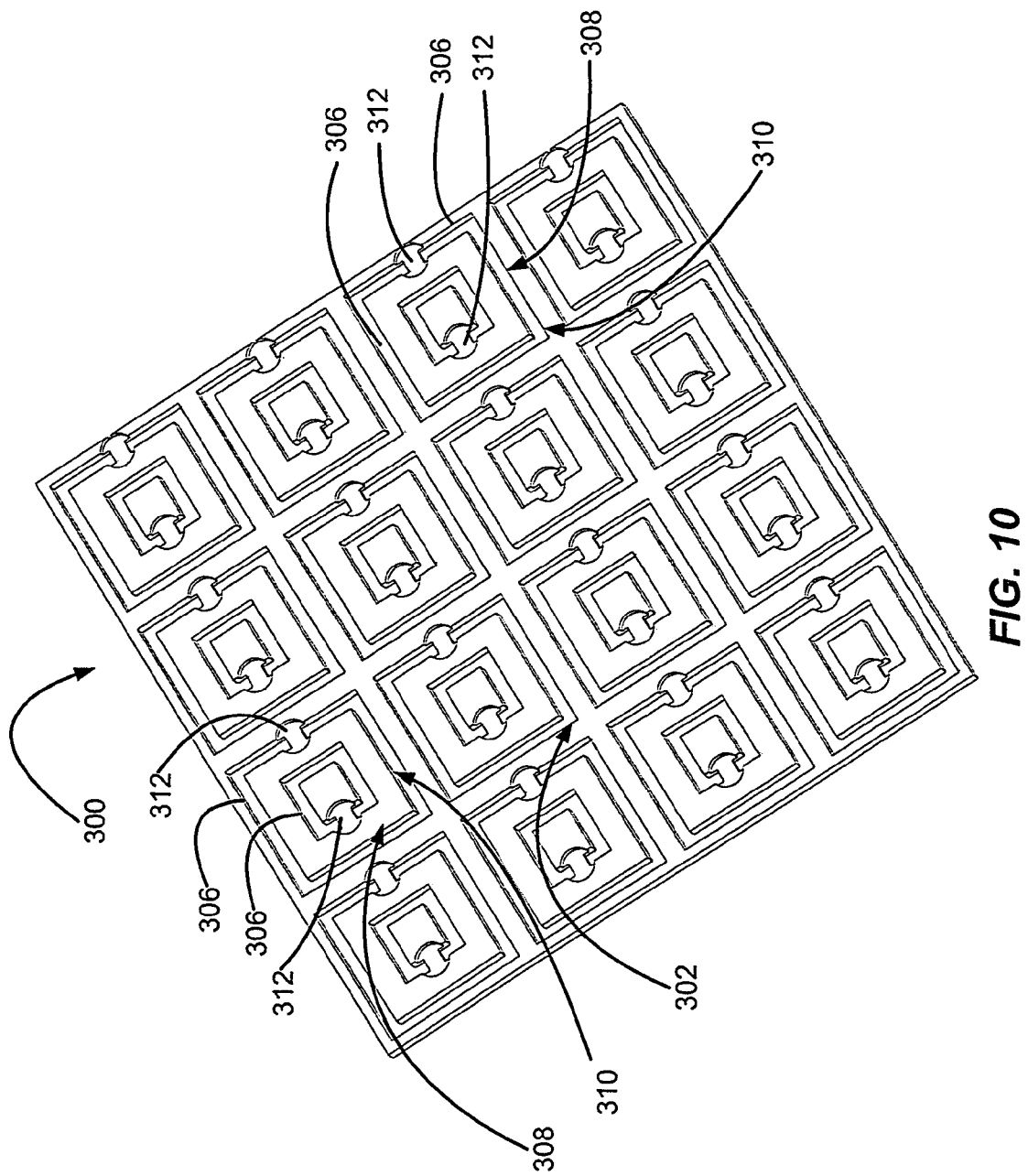
FIG. 10 is a perspective view of another embodiment of a conductor plate constructed in accordance with the teachings of the present invention.
Figure 11:
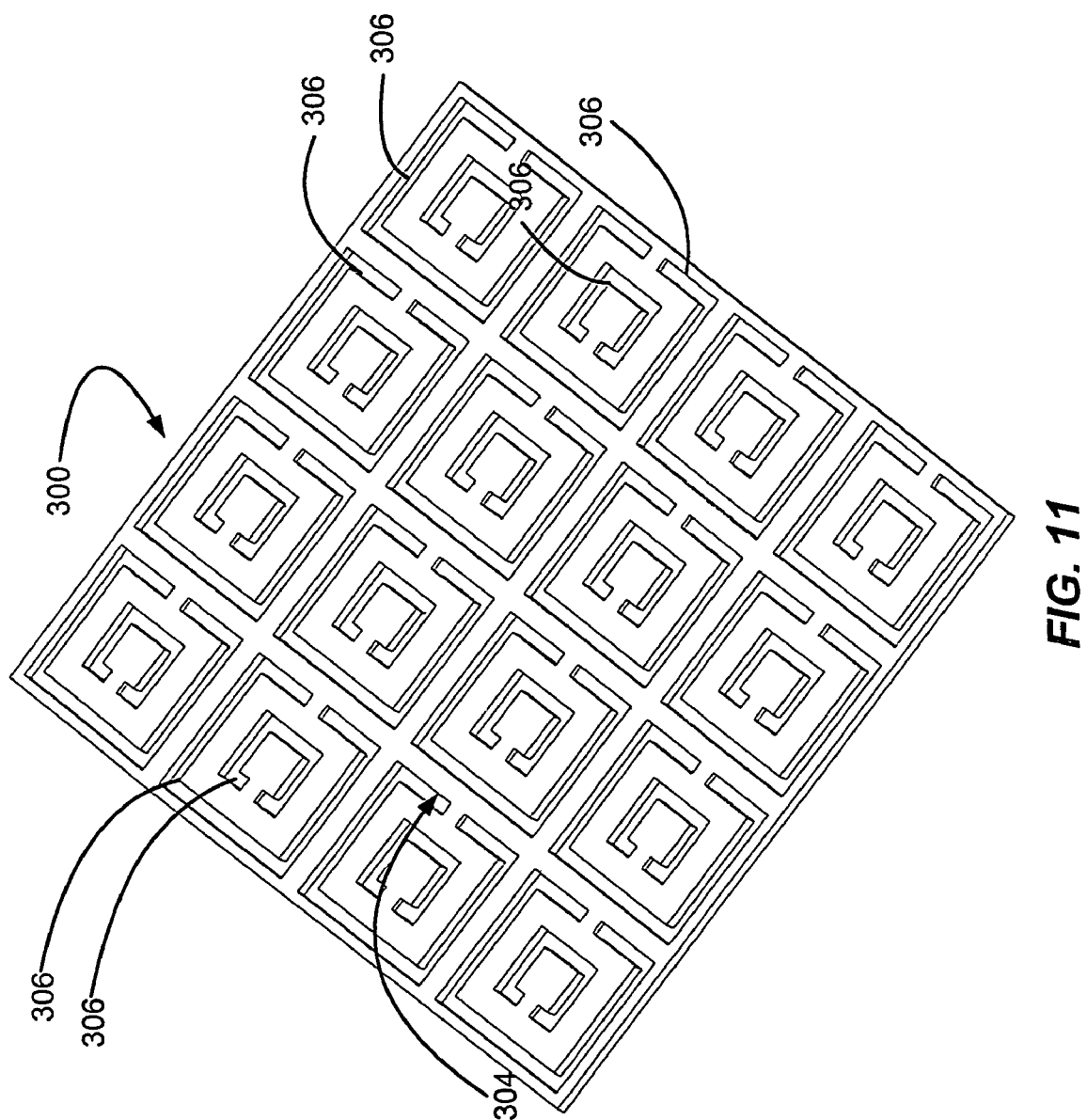
FIG. 11 is similar to FIG. 10 and shows an opposite face of the conductor plate.

With reference to FIGS. 10 and 11, another embodiment of the conductor plate 300 is shown and constructed in accordance with the teachings of the present invention. The conductor plate 300 may include a first side 302 (FIG. 10) and a second side 304 (FIG. 11). The conductor plate 300 may also include a plurality of c-shaped apertures 306 formed therein. More specifically, two opposed c-shaped channels 308 of the plurality of c-shaped channels 306 may be arranged in a square like shape 310, which may be duplicated throughout the first side 302 and the second side 304 of the conductor plate 300. Each end of c-shaped channel 306 may terminate in a dimple 312 that is only visible on the first side 302 of the conductor plate 300. On the second side 304 of the conductor plate 300, the c-shaped channels 306 are shown as the channel is cut clear through the plate unlike the dimple which is only visible on the first side. As the conductor plate 300 is compressed between two devices, the plate 300 is able to deform and make contact with the surface irregularities to thus improve electrical contract therebetween.

Figure 12:
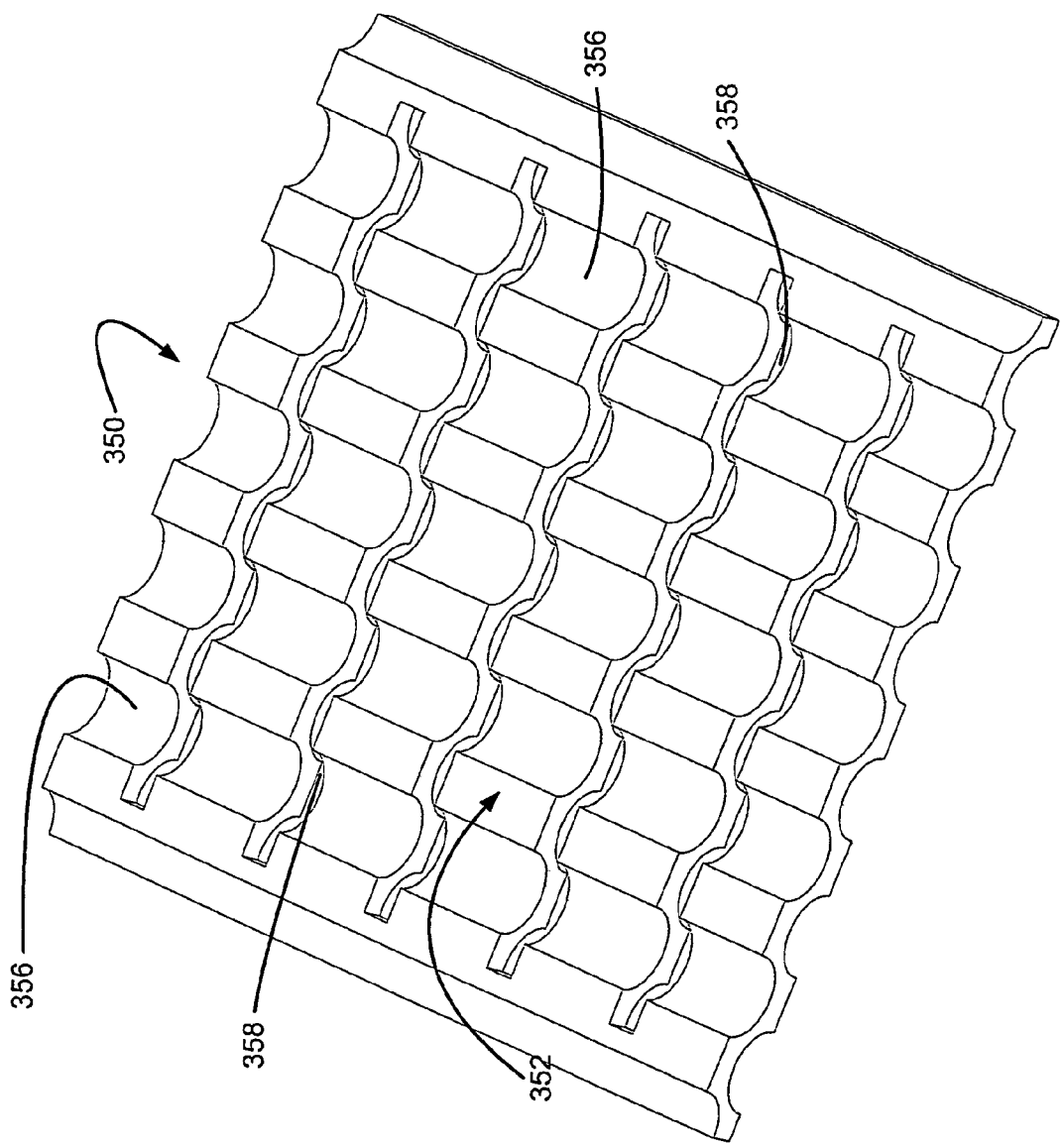
FIG. 12 is a perspective view of another embodiment of a conductor plate constructed in accordance with the teachings of the present invention.
Figure 13:
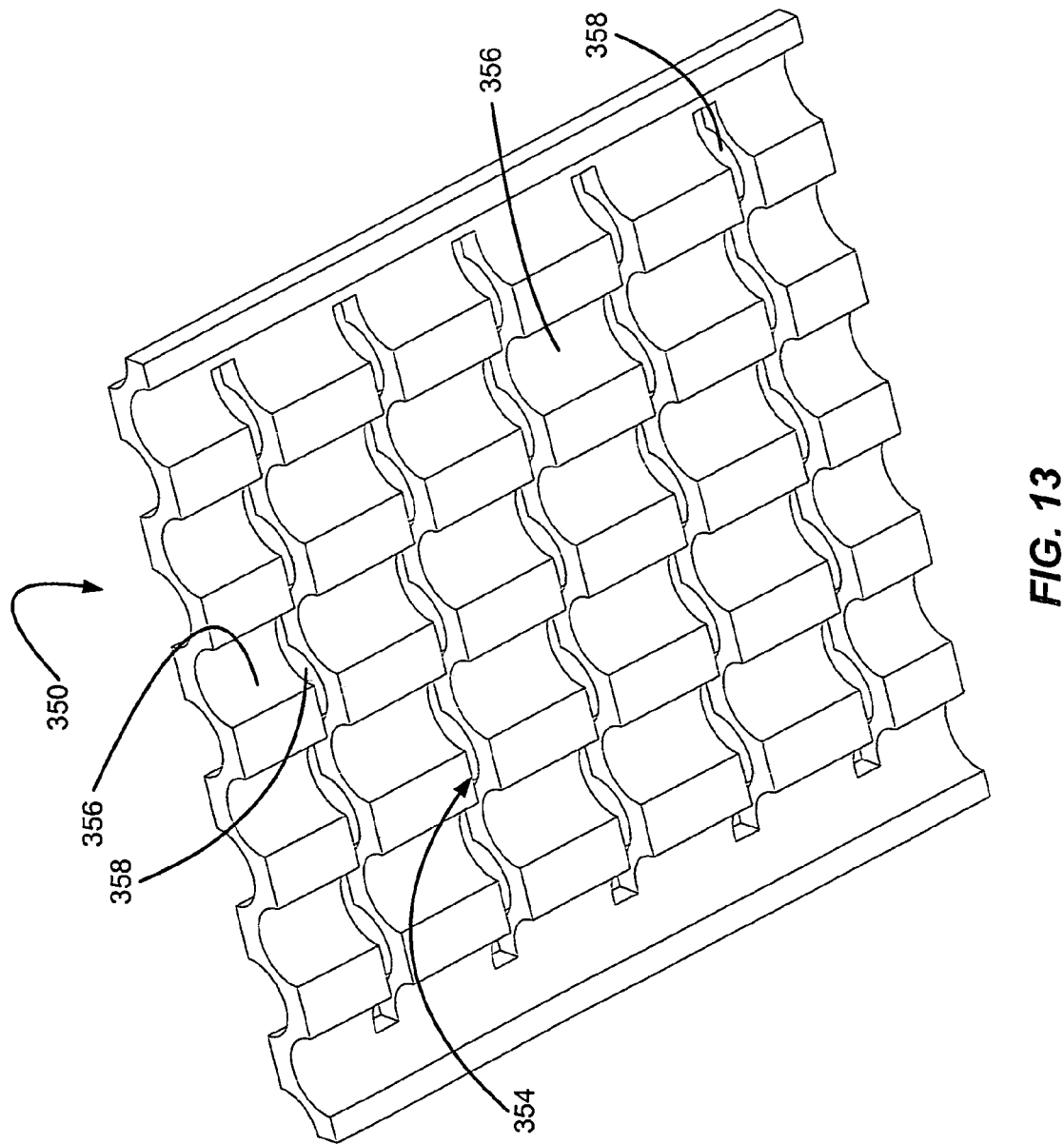
FIG. 13 is similar to FIG. 12 and shows an opposite face of the conductor plate.

With reference to FIGS. 12 and 13, another embodiment of a conductor plate 350 is shown and constructed in accordance with the teachings of the present invention. The conductor plate 350 may have a first side 352 (FIG. 12) and a second side 354 (FIG. 13). The first side 352 and the second side 354 of the conductor plate 350 may include a plurality of valleys 356 formed thereon. The plurality of valleys may intersect with a plurality of channels 358 also formed thereon. The intersecting valleys 356 and channels 358 may give the conductor plate 350 a wave-like appearance. It may be appreciated that the plurality of valleys 356 and channels 358 may be cut into the conductor plate 350 using the exemplary above-described etching processes. When the conductor plate 350 is compressed between the electrical device 12 (FIG. 2) and bus bar 14 (FIG. 2) the valleys 356 of the conductor plate 350 may compress and deform thereby making relatively better contact with the surface irregularities of the two devices 12, 14 and increase the electrical contact therebetween.

Figure 14:
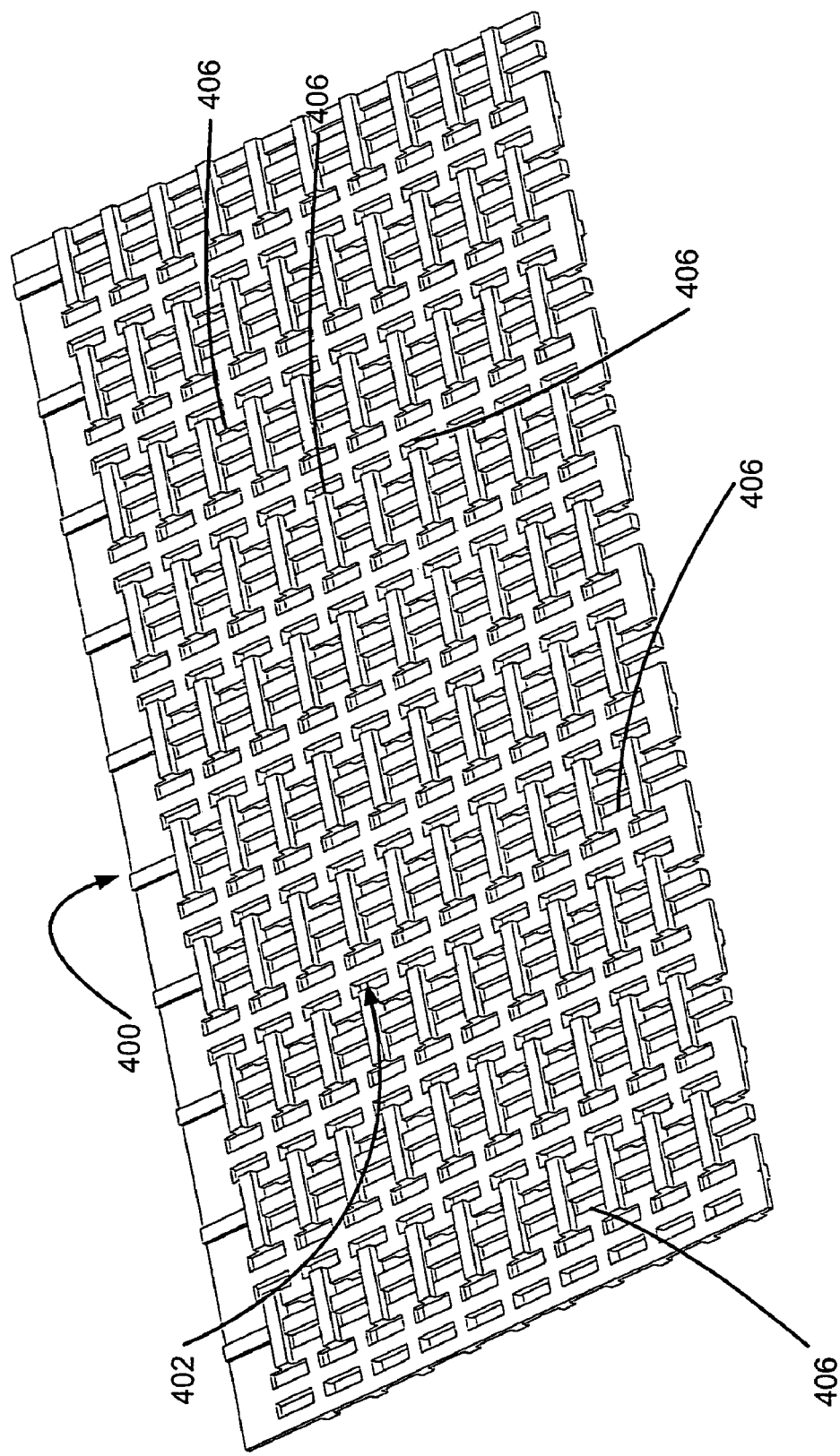
FIG. 14 is a perspective view of another embodiment of a conductor plate constructed in accordance with the teachings of the present invention.
Figure 15:
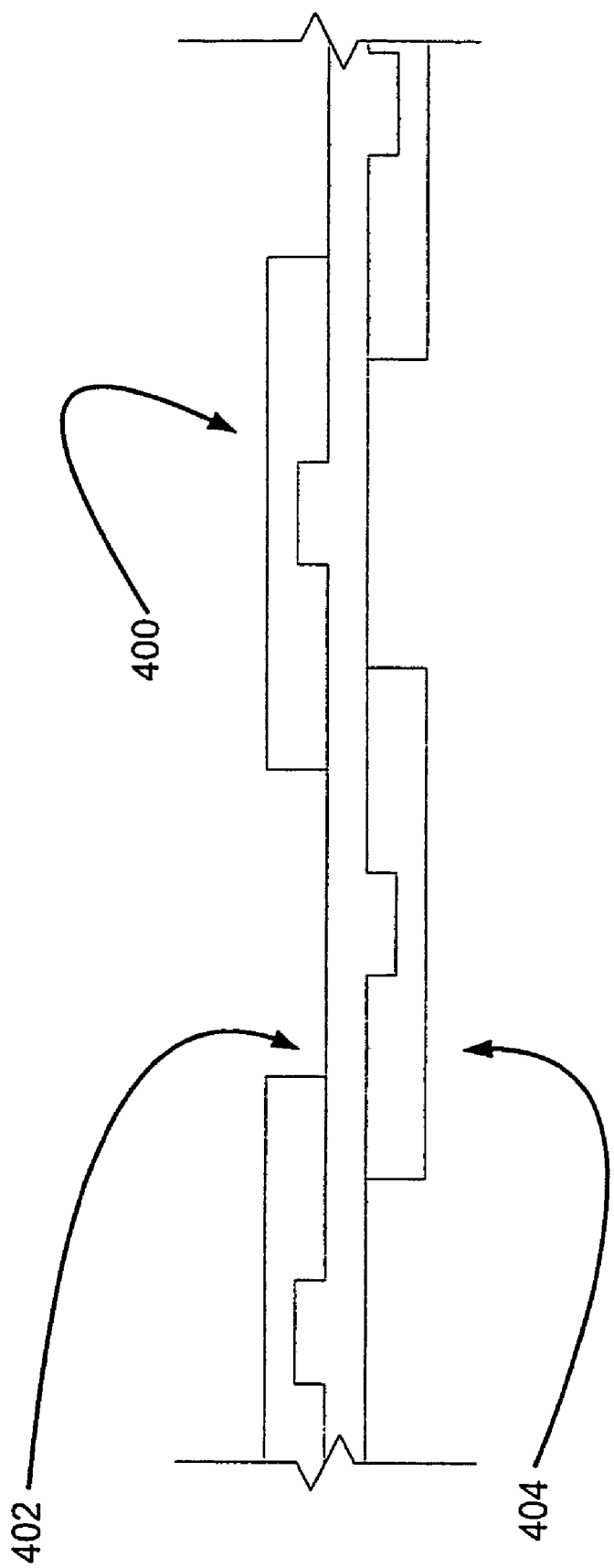
FIG. 15 is similar to FIG. 14 and shows a side view of the conductor plate.

With reference to FIGS. 14 and 15, another embodiment of a conductor plate 400 is shown and constructed in accordance with the teachings of the present invention. The conductor plate 400 may include a first side 402 and a second side 404. The conductor plate 400 may include a plurality of rectangular cut slots 406. The slots 406 may be cut from the conductor plate 400 using the above-described etching process. The conductor plate 400 may be compressed between the electrical device 12 (FIG. 2) and the bus bar 14 (FIG. 2) thereby conforming to the surface irregularities of the two devices 12, 14 to make relatively better metal-to-metal contact and increase the electrical contact therebetween.

In various embodiments, the conductor plate may be crafted by taking a rectangular plate similar to the starting plate of the above described other embodiments. An etched or stamped screen may be pressed into the conductor plate. By pressing the screen into the conductor plate a plurality of ridges and valleys are formed in the plate. After pressing the screen into the plate, the screen is removed. The plate is left with the plurality of ridges and valleys which thereby weaken the plate. The end result is similar to the above-described etching process, thus allowing the plate to be compressed between an electrical device 12 (FIG. 2) and a bus bar 14 (FIG. 2) to thereby conform to the surface irregularities of the two devices 12, 14.

Those skilled in the art may now appreciate from the foregoing description that the broad teachings of the present invention may be implemented in a variety of forms. Therefore, while this invention has been described in connection with particular examples thereof, the true scope of the inven-

What is claimed is:

1. An interface device for coupling an electrical device to a metal junction comprising:
   a conformable conductor plate having a first side and a second side;
   a first slot formed through said conformable conductor plate having a pair of generally parallel portions connected by an adjacent portion;
   a second slot formed through said conformable conductor plate having a pair of generally parallel portions connected by an adjacent portion,
   wherein said formation of said first slot and said second slot weaken said conductor plate,
   wherein one of said generally parallel portions of said first slot is disposed between said pair of generally parallel portions of said second slot,
   wherein said first slot and said second slot establish at least a first rectangular portion and a second rectangular portion of said conformable conductor plate,
   wherein said first rectangular portion is deflectable relative to said second rectangular portion.

2. The interface device of claim 1 further comprising: a plurality of protrusions formed on at least said first rectangular portion, said protrusions are deformable by coupling said conformable conductor plate between the electrical device and the metal junction.

3. The interface device of claim 2, wherein each of said protrusions include a face having a surface area that abuts one of the electrical device and the metal junction, said face increasing said surface area when compressed between the electrical device and the metal junction.

4. The interface device of claim 1, wherein said conformable conductor plate is at least in part made of at least one of copper, gold and silver.

5. The interface device of claim 1, wherein said conductor plate has a dimension defining a thickness that is about 0.003 inches (about 0.076 millimeters) and a dimension defining a width that is about 0.003 inches (about 0.076 millimeters).

6. The interface device of claim 1, wherein a width of said first slot is about equal to a thickness of said conformable conductor plate.

7. The interface device of claim 1, wherein said first side and said second side of said conformable conductor plate establish an edge around a periphery of said conformable conductor plate, wherein said first slot and said second slot are formed entirely within an interior of said conformable conductor plate and do not intersect said edge of said conformable conductor plate.

8. The interface device of claim 1, wherein said first side and said second side of said conformable conductor plate establish an edge around a periphery of said conformable conductor plate, wherein said first slot and said second slot each intersect said edge of said conformable conductor plate.

9. The interface device of claim 1 further comprising:
   a third slot formed through said conformable conductor plate having a pair of generally parallel portions connected by an adjacent portion;
   a fourth slot formed through said conformable conductor plate having a pair of generally parallel portions connected by an adjacent portion,
   wherein said formation of said third slot and said fourth slot weaken said conductor plate,
   wherein one of said generally parallel portions of said third slot is disposed between said pair of generally parallel portions of said fourth slot,
   wherein said first slot and said second slot are each disposed next to said third slot and said fourth slot on said conformable conductor plate.

10. An interface device for coupling an electrical device to a metal junction comprising:
    a conformable conductor plate having a first side and a second side;
    a first slot formed through said conformable conductor plate having a pair of generally parallel portions connected by an adjacent portion;
    a second slot formed through said conformable conductor plate having a pair of generally parallel portions connected by an adjacent portion,
    wherein said formation of said first slot and said second slot weaken said conductor plate,
    wherein said second slot is disposed within an area on said conformable conductor plate that is bounded by said generally parallel portions and said adjacent portion of said first slot,
    wherein said first slot establishes a first rectangular portion that is deflectable relative to said conformable conductor plate,
    wherein said second slot establishes a second rectangular portion within said first rectangular portion, said second rectangular portion is deflectable relative to said first rectangular portion.

11. The interface device of claim 10, wherein said parallel portion of said second slot is disposed between said adjacent portion of said first slot and said adjacent portion of said second slot.

12. The interface device of claim 10, wherein said conformable conductor plate is at least in part made of at least one of copper, gold and silver.

13. The interface device of claim 10, wherein said conductor plate has a dimension defining a thickness that is about 0.003 inches (about 0.076 millimeters) and a dimension defining a width that is about 0.003 inches (about 0.076 millimeters).

14. The interface device of claim 10, wherein a width of said first slot is about equal to a thickness of said conformable conductor plate.

15. The interface device of claim 10, wherein said first side and said second side of said conformable conductor plate establish an edge around a periphery of said conformable conductor plate, wherein said first slot and said second slot are formed entirely within an interior of said conformable conductor plate and do not intersect said edge of said conformable conductor plate.

16. The interface device of claim 10 further comprising:
    a third slot formed through said conformable conductor plate having a pair of generally parallel portions connected by an adjacent portion;
    a fourth slot formed through said conformable conductor plate having a pair of generally parallel portions connected by an adjacent portion,
    wherein said formation of said third slot and said fourth slot weaken said conductor plate,
    wherein said fourth slot is disposed within an area on said conformable conductor plate that is bounded by said generally parallel portions and said adjacent portion of said third slot,
    wherein said third slot establishes a first rectangular portion that is deflectable relative to said conformable conductor plate, wherein said fourth slot establishes a second rectangular portion in said first rectangular portion formed by said third slot, said second rectangular portion formed by said fourth slot is deflectable relative to said first rectangular portion formed by said third slot, wherein said first slot and said second slot are each disposed next to said third slot and said fourth slot on said conformable conductor plate.

\* \* \* \* \*